US008548408B2

(12) United States Patent
Jaisimha et al.

(10) Patent No.: US 8,548,408 B2
(45) Date of Patent: Oct. 1, 2013

(54) METHOD AND APPARATUS FOR UTILIZING MODULATION BASED AUDIO CORRELATION TECHNIQUE FOR MAINTAINING DYNAMIC FM STATION LIST IN SINGLE TUNER VARIANT AND ASSISTING ALTERNATE FREQUENCY SWITCHING METHODOLOGY IN SINGLE TUNER AND DUAL TUNER VARIANTS

(75) Inventors: Shree Jaisimha, Senoia, GA (US);
Tatsuya Fujisawa, Atlanta, GA (US);
Jason Hingerton, Atlanta, GA (US);
Donald Thomas, Smyrna, GA (US);
David L. Ryan, Peachtree City, GA (US); Mohammad Reza Kanji, Dearborn, MI (US)

(73) Assignee: Panasonic Automotive Systems Company of America, division of Panasonic Corporation of North America, Peachtree City, GA (US)

( * ) Notice: Subject to any disclaimer, the term of this patent is extended or adjusted under 35 U.S.C. 154(b) by 389 days.

(21) Appl. No.: 12/813,606

(22) Filed: Jun. 11, 2010

(65) Prior Publication Data
US 2011/0306313 A1    Dec. 15, 2011

(51) Int. Cl.
*H04B 1/18*    (2006.01)
(52) U.S. Cl.
USPC ................................. 455/185.1; 455/186.1
(58) Field of Classification Search
CPC .................................................. H03J 5/0263

USPC ............................................ 455/150.1–199.1
See application file for complete search history.

(56) References Cited

U.S. PATENT DOCUMENTS

| | | | | |
|---|---|---|---|---|
| 6,134,440 | A * | 10/2000 | Black | 455/436 |
| 6,181,943 | B1 * | 1/2001 | Kuo et al. | 455/437 |
| 6,611,678 | B1 * | 8/2003 | Zweig et al. | 455/161.3 |
| 6,804,510 | B1 * | 10/2004 | Bates et al. | 455/414.4 |
| 6,961,548 | B2 | 11/2005 | Groeger et al. | |
| 7,373,123 | B2 * | 5/2008 | Spellman | 455/186.1 |
| 7,603,123 | B2 * | 10/2009 | Odenwalder | 455/436 |
| 7,793,498 | B2 * | 9/2010 | Cook et al. | 60/605.2 |
| 8,290,425 | B2 * | 10/2012 | Albrett | 455/3.04 |
| 2002/0058475 | A1 | 5/2002 | Patsiokas | |
| 2008/0233954 | A1 | 9/2008 | Ibrahim et al. | |
| 2008/0287065 | A1 | 11/2008 | Eklund et al. | |
| 2009/0129361 | A1 | 5/2009 | Masamoto | |
| 2009/0233563 | A1 * | 9/2009 | Eubanks | 455/186.1 |
| 2009/0247099 | A1 | 10/2009 | Jaisimha et al. | |
| 2009/0270058 | A1 | 10/2009 | Cheng | |

* cited by examiner

*Primary Examiner* — Lana N Le
(74) *Attorney, Agent, or Firm* — Laurence S. Roach

(57) ABSTRACT

A method of operating a single-tuner radio includes tuning into a first frequency. A pause in a first signal associated with the first frequency is detected. Tuning is switched from the first frequency to a second frequency during the pause. Field-strength, multipath, adjacent channel energy, frequency offset and FM modulation for the second frequency are measured. Tuning is switched from the second frequency to the first frequency. Tuning is switched from the first frequency to the second frequency dependent upon the measuring step.

13 Claims, 9 Drawing Sheets

| Station List Learn Memory (up to 205 entries) | | | |
|---|---|---|---|
| Index | Quality | Trust Timer | Link |
| 0 | 10 | 600 | 0 |
| 1 | 8 | 600 | 0 |
| . . . . | . . . . | | |
| . | . | . . | . . |

FIG. 3

| Station List Learn Memory (up to 102 entries) | | |
|---|---|---|
| Index | Quality | Trust Timer |
|  |  |  |
|  |  |  |
| . . . . . | . . . . . . | . . . |
|  |  | . . . |

FIG. 4

METHOD AND APPARATUS FOR UTILIZING MODULATION BASED AUDIO CORRELATION TECHNIQUE FOR MAINTAINING DYNAMIC FM STATION LIST IN SINGLE TUNER VARIANT AND ASSISTING ALTERNATE FREQUENCY SWITCHING METHODOLOGY IN SINGLE TUNER AND DUAL TUNER VARIANTS

BACKGROUND OF THE INVENTION

1. Field of the Invention

The present invention relates to radios for use in vehicles, and, more particularly, to maintaining a dynamic list of FM stations in radios for use in vehicles.

2. Description of the Related Art

Driver and user personalization is a recent trend that has a potential to impact the automotive and consumer entertainment market. Original Equipment Manufacturers have taken notice of this trend and are making the radio head unit human machine interaction more intuitive, thereby differentiating their offerings to the end consumer.

One area that offers room for improvement is the navigation of FM stations. In state of the art user navigation procedures to preview valid station frequencies that can be clearly received by the radio, the user tunes, seeks or scans to a station.

OEMs have begun to require radios to provide FM station lists in order to ease the navigation user experience. An FM station list may be a list of FM stations in the vicinity of the user which are of a certain signal reception quality. Each of the stations in the FM station list may be associated with a respective pushbutton on the human machine interface, and thus the user need only push the respective pushbutton in order to tune in the station. The FM station list may enable the user to conveniently select viable stations of good signal quality without having to manually tune, seek or scan to the stations in a sequential manner (e.g., in either increasing or decreasing frequency order).

A method that OEMs have defined to allow updating of the FM station list is through the offering of a manual station list update option. When this scheme is triggered, it mutes the currently tuned-to station audio and starts to scan the FM frequency band. Stations that meet particular fieldstrength, multipath, and adjacent channel interference criteria are populated onto the FM station list. During the time period in which the FM station list is being populated, the user is presented with a visible progress bar which displays the status of the update.

A reason why the above-described FM station list population procedure is not efficient in a single tuner environment is that once a station list update has been completed, its validity is a function of the geographic location of the vehicle. Thus, if the mobile user drives away from the geographic location at which the last manual station list update was performed, then the FM station list becomes "stale." Accordingly, the user is required to again do a manual station list update to avoid the possibility of going into the FM station list and choosing a now-invalid station, which would result in poor audio reception.

As an example case in point, assume a user does a manual station list update in Georgia and drives to Indiana without doing a manual station list update. If he then enters the FM station list, the list would not clearly reflect the true nature of actual stations available in the area. With this being the case, it is possible that if a user does select a station frequency from the FM station list menu, the selected frequency is likely to not correspond to a station that has good reception at the user's current location in Indiana. Rather, the user is likely to receive a noisy signal that is of unacceptable listening quality.

One way to overcome the above-described problem of the FM station list not being updated is through the costly use of a dual tuner radio. Specifically, a dual tuner radio can update the FM station list in a manner that is imperceptible to the end user by virtue of the second tuner performing background scanning without affecting the audio path of the main tuner which is being listened to by the user.

In order to prevent wrong audio modulation to be heard during AF switch, the prior art employs dual tuner radio variants. In cases where prior to an AF switch, the PI code is not received, dual tuner radios employ what is termed as an audio correlation algorithm. The algorithm may be implemented by tuning the main tuner and second tuner to the source and target frequency, gathering the audio data, and employing auto-correlation methods to define their correlation. This may take between two and five seconds worth of audio sampling. The audio correlation algorithm requires royalty payments for dual tuner variants.

Accordingly, what is neither anticipated nor obvious in view of the prior art is a method of performing automatic updates of an FM station list in a single tuner environment without the user perceiving the occurrence of the updates, and without the user's listening experience being interrupted by the updates.

SUMMARY OF THE INVENTION

The present invention extends the application of modulation-based checks for single tuner radios operating in North America, Europe and Rest of World environments. In the North American market, broadcasters abide by the RBDS standard whereby each station is associated with a single frequency and Alternative (or Alternate) Frequency (AF) is not typically used. The European market segment and certain Rest of World contexts (e.g., Hong Kong) use the RDS standard whereby each station is associated with multiple frequencies. In cases in AF is used, the automatic update of the FM station list should not include audio content stations in duplicate.

The present invention may be applied to AF switching in either a single or double tuner environment. European countries embrace the full features set out by the RDS standard which is AF switching. The way this scheme works is that low power transmitters encompass the European FM landscape. A station operates under different frequencies whereby audio on all these alternate frequencies consists of simulcast audio and data information from the station.

A single tuner radio operating in this environment, when tuned to a RDS station, may receive the AF that the radio can switch to in case the currently tuned-to frequency fades in signal quality. Before an actual switch is done, the single tuner RDS radio may typically perform quality checks, such as for fieldstrength, multipath, adjacent channel energy, and frequency offset, for example. After the quality checks have been performed, and the AF is noted to be better than the currently tuned-to station frequency, the radio may switch over to this stronger AF after a mute operation and delve on this target station for a program ID code check. The program ID confirms that the station being switched to is transmitting the same audio as the most recently tuned-to station. This may result in mutes which can vary in time duration based on the time used for the PI wait time. The mute time duration may range between 500 ms and 1500 ms depending on the RDS block error rate, which may be affected by frequency offset errors, multi-path and/or adjacent channel activity, assuming the sampled signal is of good quality (e.g., 32 dBuV or above for field strength). If the PI code (a sixteen bit word termed "program identification code" and defined in the RBDS standard) matches the PI code of the last tuned-to station, then the AF switch occur, and an unmute of audio is performed. If the PI code does not match the sampled AF, then the radio switches back to the originally tuned-to station and unmutes. The latter is a partly failed AF switch attempt as the radio transmitter list of alternate frequencies is not fully correct because either these station frequencies are operating as regional variants, or a true case of co-channel situation exists such that the frequencies can carry different audio.

When the PI code cannot be received, then the AF switch may be delayed.

Muted PI checks may be performed for single tuner variants. OEM customers require this program ID check partly to reduce the risk of potentially switching over to a different station (with different audio modulation) and are willing to tolerate the mute. However, in order to prevent too many mutes from occurring, what is referred to as a "trust timer" is used to perform an un-muted alternate frequency switch. The trust timer may minimize the number of audible mutes.

The way this scheme works is that after acquiring the PI code through a mute, typically a trust timer is set for the frequency. The trust timer is usually a counting up timer starting from 0 seconds (the time at which the PI code is received) to a maximum of 15 minutes. The way this trust timer helps in reducing the number of mutes is such that once a single tuner radio sets the trust timer, the radio can potentially switch over to this station frequency in what is termed an unmuted PI check (frequency is switched without muting the audio) during the valid duration of the trust timer as specified by the developer. The duration of the trust timer specified by the developer can vary based on the locality and proximity of the radio stations. This approach of using a trust timer may not work well, however, in certain FM landscapes where co-channel frequency exists, e.g., where a second station uses the same alternate frequency known to the radio. In this instance, an unmuted AF switch can result in what is termed a "wrong audio modulation" lasting from the time the AF switch occurs, the radio variant tunes to this new station, senses through the reception that the new station has the wrong PI code, and finally reacts by switching back to the original frequency. To prevent the software from using the sampled frequency, what may be referred to as a "disable timer" may be set.

In summary of the above limitations on the operation of a single tuner RDS radio, there may be mutes during a PI code switch. An unmuted AF switch based on the trust timer can reduce mutes but does not combat against wrong modulation in case frequencies are reused by different stations. Stations in Europe also operate as regional variant stations. Single tuner radio variants have these operational limitations because there is no luxury of a second tuner to perform background scanning and inaudible PI checks.

The method of the present invention adds a third degree of optimization by using modulation based checks to assist the unmuted PI checks. The radio may gain confidence in the audio content through the modulation based checks. The method of the invention can serve as a complement to existing methodology. Before an actual switch is performed, a single tuner RDS radio of the invention may perform quality checks involving obtaining measurements or quantifications of field-strength, multipath, adjacent channel energy, frequency offset and FM modulation.

As mentioned above, the invention may be applied to AF switching in a dual tuner radio. In dual tuner radios, the main tuner produces the audio while the second tuner performs background scanning and assists in inaudible PI checks leading to seamless AF switches. The invention provides a low cost method to perform audio correlation in dual tuner variants, thereby avoiding royalty costs from DSP vendors in cases where PI is not received but an AF switch has to be hastened.

In one embodiment, the invention is applied to the automated maintenance of FM station lists in a single tuner environment. In another embodiment, the invention is applied to AF switching in both single and dual tuner environments. In the application to AF switching, the method of the invention performs imperceptible checks on alternate frequencies during the Pause functions and during random periods of time in cases in which the currently tuned-to station has good signal quality.

The invention may enable a radio to perform an AF switch to a potential alternate frequency in the case where the best AF has good signal quality but a high RDS block error rate resulting in cases where Program ID code reception is not easily possible. Specifically, quick modulation based checks may be performed in order to distinguish whether the audio content on the AF is the same as the audio content on the currently tuned-to frequency. The invention may enable a radio to limit the risk of switching to an AF during unmuted PI checks on a single tuner variant.

FM audio is broadcast at a maximum of 15 kHz. Thus, if the modulation checks are performed at periodic intervals of 67 microsecond (=1/15,000 sec) to avoid aliasing and to satisfy Nyquist sampling criteria, then an audio correlation data snapshot may be gathered. In cases where pause durations are limited due the nature of the audio content being listened to, the radio can perform limited quick modulation and quality checks of 7 milliseconds duration at intervals of 67 microseconds spaced out to gather modulation data using a perceptual filter of the invention, which is described herein below. The modulation data that is gathered builds up a confidence level metric which can be used to hasten the AF switch in cases when it is warranted provided the confidence level built up exceeds a specified threshold.

If two frequencies have the same audio content, typically a pause in the currently tuned-to station will indicate a pause also exists in the target AF if the premise that the AF has simulcast audio is true. Thus, the modulation levels of the two frequencies will have a strong correlation assuming that audio is simulcast on both stations with no delay, as is the case with RDS stations. Performed modulation checks will enhance what is referred to as "audio correlation level," and cause the audio correlation level to build up. When an AF switch is warranted due to signal fade on a currently tuned-to station, and the target AF station's signal has good quality, an AF switch can be attempted without invoking the costly PI check. Pause durations can occur in both music and speech broadcasts on a radio station.

The modulation checks may be performed on strong frequencies only, which may be both currently tuned-to and target frequencies. Weak stations suffer from static noise, which can be modeled as white noise. Modulation checks on noisy stations may not yield accurate readings because the noise will be random in nature and will lead to false information.

The invention provides four options for the automatic update of the FM station list. First, when a user is tuned to an FM station and the volume knob is set to a perceivable volume level, then automatic quality checks of neighboring frequencies may be triggered whenever there is a pause in the currently tuned-to station's audio. The novelty of this idea is extended in the second through fourth options described below.

A second option for the automatic update of the FM station list is that when a user is tuned to an FM station and the volume knob is set to a perceivable volume level, then automatic quality checks of neighboring frequencies may be triggered whenever the currently tuned-to audio signal quality is poor. In one embodiment, the present invention provides a novel perceptual based table which characterizes the signal quality level. The characterization of the signal quality level may be used to trigger a 7 milliseconds long, unperceivable quality check of a neighboring frequency.

A third option for the automatic update of the FM station list is that when a user is tuned to an FM station and the volume knob is set to total mute (or if a mute pushbutton is activated), then the neighboring frequencies are checked and updated onto the FM station list. Additionally in this case, since the audio itself if totally muted, longer delve time on a station can be supported (e.g., 500 ms) to be able to acquire PI code, which in turn can be converted into FCC call letters based on the translation table in the RBDS standard. This gives the user more content information of the station other than frequency. If a user were to increase the volume knob to a perceived level (or de-activate the mute pushbutton), then these checks are stopped and an update of the FM station list is performed through pause-based updates as described in association with the first option above.

A fourth option for the automatic update of the FM station list is that when a user is sourced to a non-tuner source (e.g., CD mode, auxiliary mode), then the update of the FM station list can freely be performed without the concern that the update will be perceived by the user.

Averaged modulation checks may be performed to ensure duplicate entries of stations do not enter the FM station list. For example, the contents of two stations' broadcasts may be compared to each other, and if the same, then only the station with the stronger signal is added to the FM station list. The phrase "update of FM station list" or similar as used herein may include both the addition of strong stations and the deletion of weak stations in the FM station list during the user operation of the radio head unit.

As described herein, the invention may be applied to alternate frequency switching methodology. The invention may provide a method for a single tuner radio variant to perform quick and unperceived quality and modulation level checks and build up a confidence level based on audio correlation. The confidence level may be used prior to an AF switch in cases where the target station does not yield a program ID code, or in cases where an unmuted AF switch is to take place. The invention may complement the existing single tuner methodology used for RDS AF switching to allow for faster AF switching while optimizing the number of mutes and avoiding wrong audio modulation.

The invention comprises, in one form thereof, a method of operating a single-tuner radio including tuning into a first frequency. A pause in a first signal associated with the first frequency is detected. Tuning is switched from the first frequency to a second frequency during the pause. Fieldstrength, multipath, adjacent channel energy, frequency offset and FM modulation for the second frequency is measured. Tuning is switched from the second frequency to the first frequency. Tuning is switched from the first frequency to the second frequency dependent upon the measuring step.

The invention comprises, in another form thereof, a method of maintaining an FM radio station list. A primary frequency is included in the FM radio station list. A potential alternate frequency is identified. An alternate frequency switch to the potential alternate frequency is performed. A modulation based check on the alternate frequency is performed. It is determined whether the content of the alternate frequency is the same as content on the primary frequency. The determining is dependent upon the modulation based check. The primary frequency in the FM radio station list is replaced with the alternate frequency only if it is determined in the determining step that the content of the alternate frequency is the same as content on the primary frequency.

The invention comprises, in yet another form thereof, a method of maintaining an FM radio station list, including tuning a radio to a first frequency. It is determined whether a volume setting of the radio is above a perceivable volume threshold level. If it is determined that the volume setting of the radio is above the perceivable volume threshold level, then a signal quality metric for the first frequency is measured. If it is determined that the measured signal quality metric for the first frequency is below a signal quality threshold level, or if a pause is detected in a broadcast signal associated with the first frequency, then tuning is switched from the first frequency to a second frequency. A signal quality metric for the second frequency is measured. Tuning is switched from the second frequency to the first frequency. If it is determined that the volume setting of the radio is below the perceivable volume threshold level, then tuning is switched from the first frequency to the second frequency. A signal quality metric for the second frequency is measured. Tuning is switched from the second frequency to the first frequency.

An advantage of the present invention is that it enables an end user to perform the same background update of an FM station list as may be done in a dual tuner radio with the low cost benefit of using only a single tuner. The FM station list update may be imperceptible to the user via the single tuner method of the present invention, just as it is with the prior art dual tuner method.

Another advantage is that the present invention may be applied to non-automotive products, such as cell phones and USB products with built-in FM receivers, for which FM single tuners have become the de facto standard.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 3 is a table depicting one embodiment of a station list learn memory for the European market according to the invention.

FIG. 4 is a table depicting one embodiment of a station list learn memory for the North American market according to the invention.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
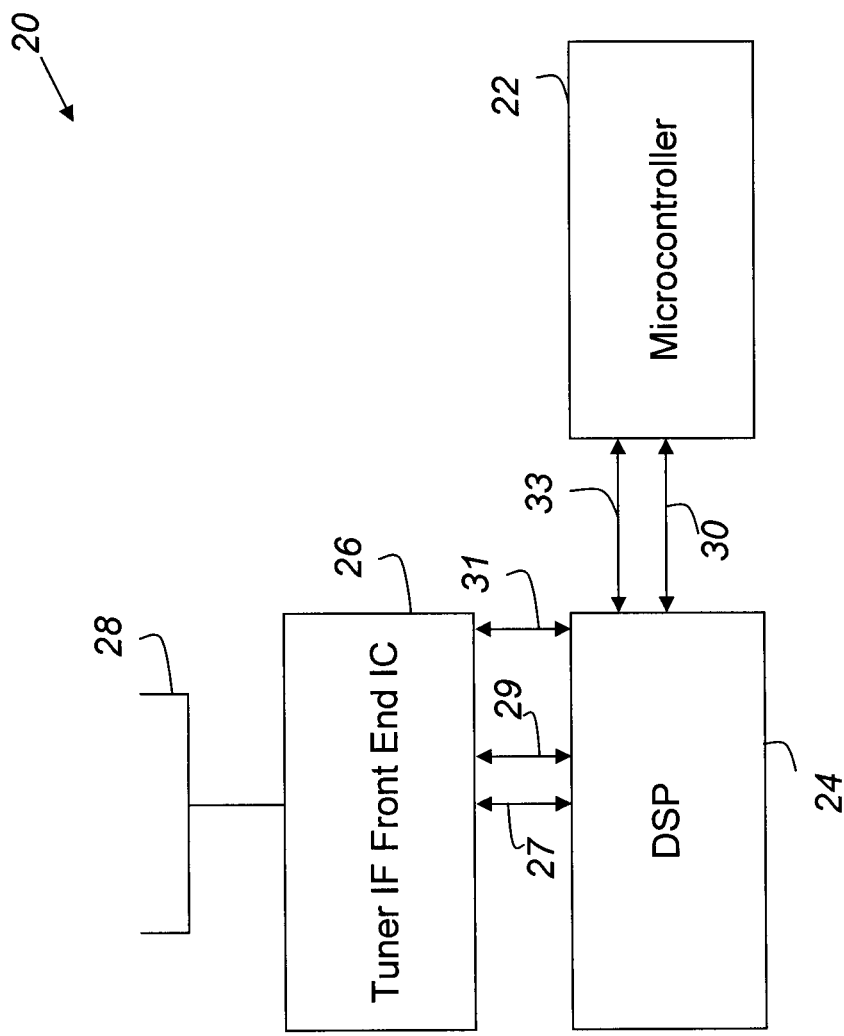
FIG. 1 is a block diagram illustrating one embodiment of a single tuner radio system of the present invention.

Referring now to the drawings, and particularly to FIG. 1, there is shown one embodiment of a single tuner radio system 20 of the present invention. Radio system 20 may include a microcontroller 22 which may be used to process user input. A digital signal processor (DSP) 24 may be used to provide audio demodulation of the air-borne Intermediate Frequency (IF) input signal. DSP 24 may also be used to provide quality information parameters to the main microcontroller 22 via a serial communication protocol such as I2C. The quality information parameters may include multipath, adjacent channel noise, FM frequency offset, FM modulation and field strength. The I2C channel may be a dedicated channel so that delays due to shared resource contentions are prevented. DSP 24 may rely on a Tuner IF Front End IC 26 to perform the front end RF demodulation and the gain control. Tuner IF Front End IC 26 may also output the IF to DSP 24 where the IF may be demodulated and processed. Tuner IF Front End IC 26 may further provide a gain to the IF signal of up to 6 dBuV prior to forwarding the signal to DSP 24. Communication between Tuner IF Front End IC 26 and DSP 24, as indicated at 27, may be via a serial communication protocol such as I2C, which may operate at 400 kbps.

An antenna system 28 may be communicatively coupled to Tuner IF Front End IC 26. Antenna system 28 may be in the form of a passive mast, or an active mast of phase diversity, for example.

An AF sample line 29 and an AF hold line 31 provide an interface between DSP 24 and Tuner IF Front End IC 26 to coordinate a quick mute as described hereinbelow. A pause interrupt line 33 between DSP 24 and microcontroller 22 may be used to inform microcontroller 22 whenever a pause occurs.

DSP 24 may provide signal quality parameterization of demodulated tuner audio and may make it available to microcontroller 22 via a serial communication bus 30. In one embodiment, serial communication bus 30 is in the form of a 400 kbps high speed I2C.

The signal parameterization may include field strength, multipath, FM frequency offset, FM modulation and ultrasonic noise. Field strength may give an indication of signal reception and may help determine whether the radio station has good signal coverage in the vicinity of the user. This field strength quality parameter may be applicable for both AM and FM modulation signal reception.

Although the signal can have high field strength, it can be subject to reflections which can arise from trees and tall building which reflect/deflect the signal. The multipath parameter may enable the level of multipath to be ascertained, and may affect reception quality. The multipath quality parameter may be more applicable to FM modulation signal reception than to AM because in AM reception the wavelength is wider.

With regard to the ultrasonic noise quality parameter, it sometimes happens that stations over-modulate their signal leading to adjacent channel interference. For example, in the U.S., FM frequencies are spaced apart 200 kHz. There can arise times in which an adjacent station over-modulates its signal past the 75 kHz modulation and beyond the 50 kHz guard band, which may result in the adjacent station being heard on the tuned-to station's frequency.

With regard to the FM modulation quality parameter, the detector may provide the amount of frequency deviation about the FM carrier center frequency. The amount of frequency deviation may be directly proportional to the audio content being played in the FM station. The typical modulation bounds of this detect is 75 kHz for North America and between 22.5 kHz and 40 kHz for Rest of World and Europe. The FM modulation quality parameter is discussed in more detail hereinbelow.

The quality parameter of FM frequency offset is a measure of misalignment between modulation and demodulation frequencies. The misalignment value is typically small. However, a large offset error in the form of a large misalignment value may signify strong adjacent channel presence. Alternatively, a large offset error in the form of a large misalignment value may signify that the transmitting station is a "pirate" station and is not operating exactly on its assigned frequency, but rather has an inherent offset error. This tends to occur in Italy.

A novel feature of the present invention is the sampling of FM signals while the user is listening to an FM signal as the current foreground source. The difficulty associated with performing the sensitivity check while in FM mode, especially in a single tuner environment, is that the tuner to which the listener is listening has to momentarily switch to another station, perform the quality check, and then re-tune to the listened-to station. The user is not able to listen to the station during the time period between the switching of the station and the re-tuning of the station. This interruption in the signal of the listened-to station may be perceptible by the user, and thus may be a source of annoyance to the user.

If the audio system is in compact disc (CD) mode or is using some other non-tuner source, the bandscan checks of the frequencies can be easily performed as the tuner can perform the checks without the checks being perceptible to the user since the user is listening to a non-tuner source. To be able to perform the checks in an imperceptible manner, the present invention may utilize a DSP including pause detection logic that is able to detect pauses (i.e., periods of silence or unvoiced activity) in the demodulated audio stream. In one embodiment, pause is detected by computing the number of zero crossings in a particular window of time, wherein a zero crossing may be defined as the value where the modulation drops to zero or nearly zero. In addition, or alternatively, pause may be detected by utilizing a signal strength threshold below which the audio may be characterized as being in a pause. In one embodiment, a pause may be recognized when the duration of the pause exceeds about 40 milliseconds.

It may be assumed that the longer the period of time that a pause has gone on, the longer the period of time that the pause will continue in the future. Thus, a quality check may be initiated after a pause has gone on for a predetermined period of time, such as 40 milliseconds, on the assumption that the pause is more likely to continue long enough for the quality check to be completed.

Each recognized pause may interrupt the main microprocessor, which may then query a neighboring frequency for the quality value of the neighboring frequency. The quality value may be a function of multipath, signal strength, FM frequency offset, FM modulation and/or adjacent channel noise (also termed "ultrasonic noise").

Figure 2:
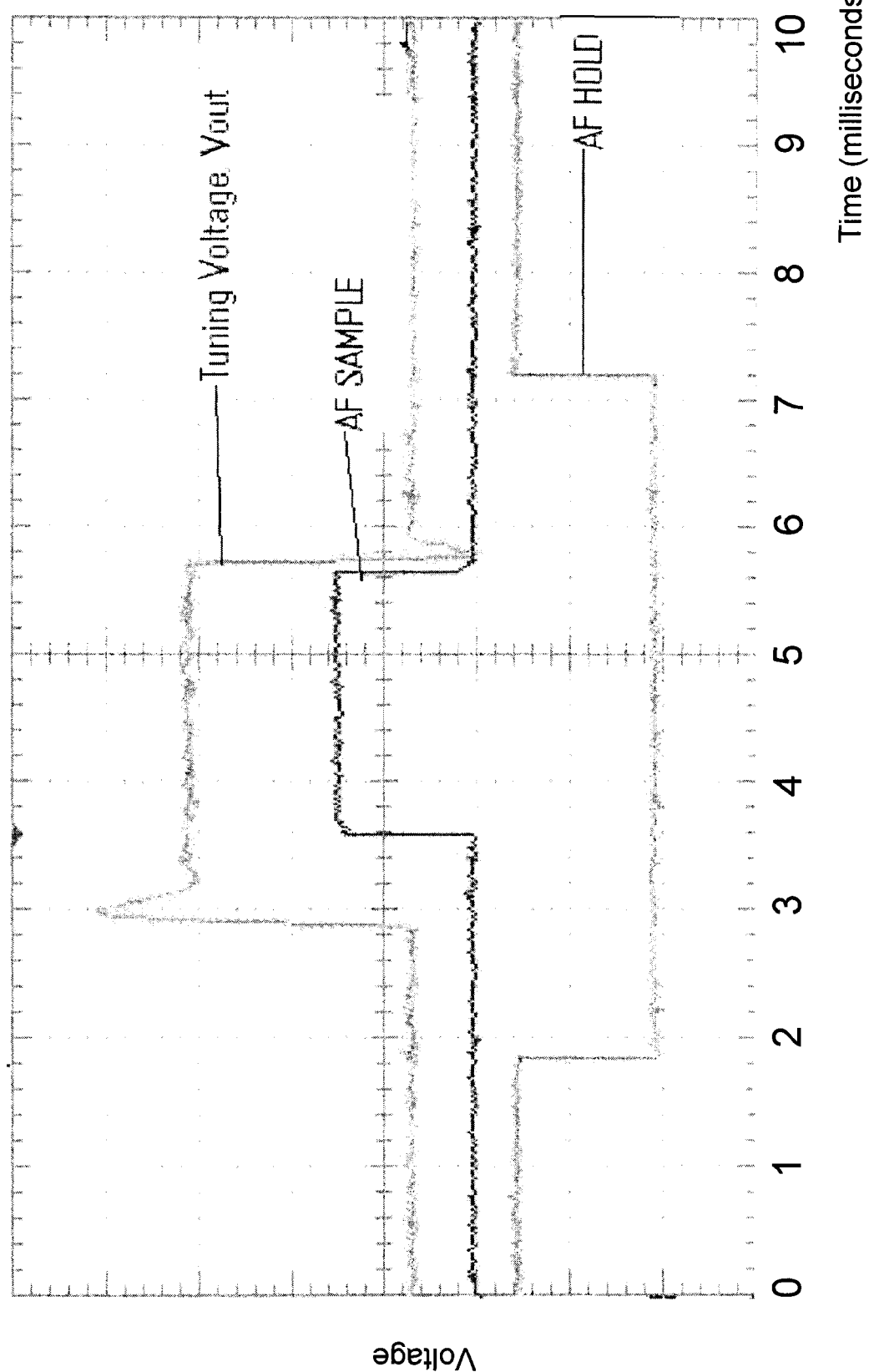
FIG. 2 is a timing diagram depicting the muting during a neighbor frequency check.

FIG. 2 is a timing diagram depicting the muting during a neighbor frequency check triggered by the pause detection logic of DSP 24. The muting may occur while the audio frequency (AF) Hold line is LOW, as indicated at 32. In the example illustrated in FIG. 2, the neighbor frequency check indicated at 32 has a duration of about 5.2 milliseconds using Tuner IF Front End IC 26 interacting with DSP 24. The magnitude of the tuning voltage may be dependent on the neighbor frequency jump, i.e., on the frequency difference between the currently listened-to frequency and the neighbor frequency to be checked. The overall time required to perform a neighbor check may be about 7 milliseconds in one embodiment. The AF Hold line may go LOW in order to mute the audio prior to the actual tuning of Tuner IF Front End IC 26 to the particular neighboring frequency, which tuning is indicated at 34. After the commencement of tuning, as indicated at 36, about one millisecond may be provided for settling of phase-locked loop (PLL) locking prior to actual sampling being performed during the time that the AF Sample line goes HIGH, as indicated at 38. After the quality AF Sample check, the tuning frequency may be set back to the originally listened-to station, as indicated at 40. After the tuning frequency is set back, time may be provided for PLL setting before the AF Hold Line goes HIGH, as indicated at 42, to unmute the audio of the presently listened-to station.

In one embodiment, after Tuner IF Front End IC 26 has switched to the neighboring frequency, as indicated at 34, the quality sample check is performed to gather readings of the five parameters of fieldstrength, multipath, ultrasonic noise, FM frequency offset and FM modulation. The readings may be gathered via an I2C bus which is set at 400 kbps. In order to promote fast access and avoid having to make five consecutive I2C reads from five separate and disparate memory locations in the DSP 24 for the fieldstrength, multipath, ultrasonic noise, FM frequency offset and FM modulation parameters, DSP 24 may support calling the five registers which hold this information through one I2C read. In order to enable the single I2C read, DSP 24 may support autoincrement and the ability to map disparate memory locations via pointer access. These features may be instrumental in performing the quality sample check within the stipulated time frame and in avoiding the mute, i.e., the interruption of the audible broadcast, from being perceived by passengers of the vehicle.

When the quality sample check is performed on the neighboring frequency, the audio is muted for up to 5.2 milliseconds, i.e., the approximate duration of 32 in FIG. 2, which may be imperceptible by the user.

When the audio system is in tuner mode, each quality sample check may take about 7 milliseconds, which may be imperceptible to listeners so long as the quality sample checks are not performed consecutively, i.e., back to back, with no breaks in between. In one embodiment, precautions may be added in order to prevent or inhibit consecutive quality sample checks from being performed. Otherwise, consecutive performance of the checks could result in an interruption of the audible broadcast of greater than 7 milliseconds, which could be perceptible to the end user listeners.

Preventing checks from occurring consecutively (e.g., back to back) is a feature of the invention that may be applied to both automated FM station list and AF switching methodology. In order to inhibit or prevent checks from being performed back to back or consecutively, which can result in the user perceiving the audio mute, a one-shot timer may be set each time a check is performed. The setting of the one-shot timer may ensure that even if there were to be a pause detect trigger immediately after a previous pause detect triggered check has been performed, the second check would be performed only if this timer has elapsed. Thus, the quality check may be an AND logic condition, meaning that a pause has occurred AND the timer is not running. If pause occurs and Timer is running, then the quality check is ignored. This consecutive check prevention one-shot timer may be calibratable.

Ensuring quality check efficiency is another feature of the invention that may be applied to both automated FM station list and AF switching methodology. The FM frequency band in the North American market has 102 frequencies ranging from 87.7 MHz to 107.9 MHz. In order to enhance efficiency in the quality sample checks, a trust timer in software may be utilized when quality check is performed on a station frequency to ensure further checks are postponed in order to achieve check efficiency. The timer value may be decremented using speed information provided by a vehicle local area network, or may be decremented by periodic tick. As soon as a station has been sampled for quality, a timer associated with that particular station may be set. As long as the timer is valid (i.e., has a non-zero value), a quality check may not be performed again on that station. Once the timer decrements to zero however, another quality check may be performed.

The trust timer may be decremented either by periodic timer tick or through speed information provided by the local area network within the car. The timer decrement via speed information may be particularly advantageous in one embodiment because if the vehicle is stationary there is no decrement of the timer. The rate of decrement may be dependent upon the speed of the vehicle.

Preventing alternate frequencies from getting into the FM station list and sensing the same audio modulation in two alternate frequencies is another feature of the invention that may be applied to both automated FM station list and AF switching methodology. A problem with maintaining an FM station list in mobile devices in European countries is that European countries support the concept of alternate frequencies mapped to a single station. Each station in Europe is identified by a PI code, and typically each station is mapped to as many as ten or more alternate frequencies.

The challenge this poses is to imperceptibly ensure that duplicate entries do not get into the FM station list. One way to prevent such duplicate entries involves delving on a candidate station long enough to acquire its PI code, which may take 500 ms or more based on signal quality such that RDS synchronization of the 57 kHz carrier of the FM MPX signal is acquired. If the PI code of the candidate station is the same as that of an existing station on the list, then the insertion of the candidate station on the list is prevented. However, this method may call for a 500 ms mute on a single tuner, and such a long mute can be easily perceived by the end user. Even if a station is harbored on for 500 ms, if the frequency's quality level is low, then a high RDS block error rate (resulting in intermittent synchronization loss) may prevent the RDS decoder at the DSP from acquiring a PI code properly.

An alternative method of populating the FM station list is to use a dual tuner radio where the second tuner is dedicated to background scanning. This entails higher cost of implementation due to the cost of the second tuner and associated hardware.

Since mobile users (especially FM single tuners in cellphones) can travel across continents, the way that the FM receiver knows that it is in the European market is if the currently tuned-to station has a PI code with the country nibble set as a country in the European Union AND the Extended Country Code transmitted by the tuned-to FM station is also set as a country in the European Union.

The method by which the invention overcomes the above-described challenges is detailed hereinbelow beginning with FM modulation theory. Fm modulation is a form of angle modulation in which the base-band signal modulates the frequency of a carrier wave.

In FM modulation theory, the instantaneous frequency of an FM modulation station is depicted by the following formula:

$$F_i(t) = F_c + K_{VCO} m(t) \quad (1)$$

where $F_i(t)$ is the instantaneous FM frequency deviation, $F_c$ is the carrier frequency, $K_{VCO}$ is the voltage to frequency gain of the Voltage Controlled Oscillator (VCO) with units of Hz/V and m(t) is the message signal.

The instantaneous phase of the output FM signal in turn translates to:

$$\Theta = 2\pi F_c(t) + 2\pi K_{VCO} \int_0^t m(t) dt \quad (2)$$

where $\Theta$ is the instantaneous phase of the transmitter signal, $F_c$ is the carrier frequency, $K_{VCO}$ is the voltage to frequency gain of the Voltage Controlled Oscillator (VCO) with the units of Hz/V and m(t) is the message signal that is modulated onto the carrier wave. The message signal m(t) may be either speech or music that is transmitted by the FM radio stations. The typical bandwidth allowed for these two entities is 15 kHz.

The carrier wave frequency ranges from 87.7 MHz to 107.9 MHz for the North American market, 87.5 MHz to 108.0 MHz for the European and Rest Of World market, and 76 MHz to 90 MHz for Japan. However, U.S. FM digital broadcasting in the future may be in the range of 88.1 MHz to 107.9 MHz.

The transmitted FM signal may be defined as:

$$X_{FM}(t) = A_c \cos\left[2\pi F_c(t) + 2\pi K_{VCO} \int_0^t m(t) dt\right] \quad (3)$$

where $F_c$ is the carrier frequency, $K_{VCO}$ is the voltage to frequency gain of the Voltage Controlled Oscillator (VCO) with units of Hz/V and m(t) is the message signal that is modulated onto the carrier wave and $A_c$ is the amplitude of the FM carrier signal.

As made evident by Equation 3, the amplitude of the FM signal is constant regardless of the modulated message signal. If m(t) is set to be $A_m \cos 2\pi F_m(t)$ for example, Equation 3 can be rewritten into the following:

$$X_{FM}(t) = A_c \cos\left[2\pi F_c(t) + \frac{K_{vco} A_m}{F_m} \sin 2\pi F_m(t)\right] \quad (4)$$

In Equation 4, the value $K_{VCO} A_m$, may be termed "$\Delta f$", allowing Equation 4 to be expressed as:

$$X_{FM}(t) = A_c \cos\left[2\pi F_c(t) + \frac{\Delta f}{F_m} \sin 2\pi F_m(t)\right] \quad (5)$$

In North America, $\Delta f$ translates to a maximum bound of 75 kHz due to the 200 kHz FM step size. In Europe and Rest Of the World, which utilizes 100 kHz FM frequency step size, this is of the order of slightly over 22.5 kHz. The term $F_m$ is typically on the order of 15 kHz for FM stations.

Thus, $\Delta f$ is the peak frequency deviation of the FM signal from the center frequency of the Carrier Wave and is directly proportional to the amplitude of the modulated message signal $A_m$ and the gain of the VCO ($K_{VCO}$). The quantity $\Delta f$ may be gauged through FM modulation detection readout through the DSP as mentioned above. Thus, FM modulation detection can perform a simple form of audio correlation. When two stations have the same audio, their modulation levels are in phase. In contrast, when two stations have different audio content, their modulation is not in tandem.

If the currently tuned-to station is an RDS station, typically the FM receiver acquires the list of Alternative Frequencies of the tuned-to station supplied via the RDS protocol provided that the signal that is tuned-to is of good quality. This helps by specifying which frequencies to lock out from the FM station list. However, in a single tuner environment, it may not be possible for the tuner to acquire the AFs of stations that are not tuned-to.

As an example, assume that the radio is tuned to station BAYERN1 in Germany. This station has a PI code, and when this station is tuned-to, the AF list (Network and Tower List) is acquired from the RDS subcarrier which is situated at the 57 kHz offset of the FM multiplexed signal (FM MPX), provided the tuned station is of good quality and the RDS synchronization is consistent (e.g., the RDS block error rate is less than 20%).

Over time, the tuner may build up all the AFs of the tuned-to station and update its Station List memory from which the FM station list is derived. However, the FM station list may include all high quality stations in the vicinity of the user, which means the tuner should imperceptibly sample the frequencies in the band other than the tuned-to station and its AFs. The challenge herein again is that when the non-tuned stations are to be populated into the FM station list, care has to be taken to prevent duplicate entries of these other stations (e.g., the stations' alternate frequencies) from entering into the FM station list. Another challenge is to prevent duplicate entries into the FM station list when the tuner is sourced to an FM source and the user is listening to a station.

If the radio is using a non-tuner source of audio content, then the tuner can easily do a bandscan involving a delve time of at least 500 ms per frequency to acquire the PI code of the station and populate the FM station list with only the strongest frequency for the particular PI code. The invention achieves this in FM mode by doing a simple audio correlation-like check to ensure that stations having the same audio content are not both populated into the FM station list.

In one embodiment, on a first battery connect or what is termed as cold start, the FM station list is empty by default. Quality checks are performed on the currently tuned-to station. If the tuned-to station (the station being listened to by the user) has an acceptable audio quality, then the station is inserted into the FM station list. In contrast, if the tuned-to station does not have an acceptable audio quality, then the first entry into the FM station list is performed through imperceptible neighbor channel quality checks. Once there exists a single valid FM station on the FM station list as a result of the above process, subsequent entry of stations found through the imperceptible quality checks of the neighboring stations is performed only after the modulation of the existing station in the FM station list is compared with the modulation of the "new," "target" or "candidate" neighboring FM station.

This "audio correlation" process may include two quick subsequent back to back I2C write and read checks on the existing station in the FM station list and the target neighbor frequency. The trigger for this may be a pause interrupt from the DSP. Once this pause interrupt is received, the software may tune the tuner IC to the station in the FM station list and acquire the quality measurements within 7 milliseconds. Immediately after this, another I2C write is done to tell the tuner IC to tune to the new candidate FM station list entry station and quality measurements are acquired. Each quality read may include fieldstrength, multipath, ultrasonic noise, frequency offset and modulation.

In one embodiment, two quick subsequent or back to back checks between the target station and the source station constitutes one valid modulation snapshot check. The modulation level is valid only if the other quality criteria are met.

The modulation snapshot is used if the other quality metrics, namely fieldstrength, multipath, adjacent channel energy and FM frequency offset, are all within limits. Else the snapshot is discarded and not used. This is in light of the fact that modulation checks between the source and the target station are valid only if both signal quality levels are good to avoid sampling a station with potential static noise which can skew the confidence level due to its random nature. In one embodiment, a four sample average (which may be calibratable) of the modulation is calculated before it is decided whether or not to insert the new station into the station list based upon analyzing the modulation difference. The modulation difference may be calculated in Equation 6 below as:

FM Modulation difference=[Average Modulation difference (of existing station entry in FM station list)−Average modulation difference of potential new entrant]/[Average Modulation difference (of existing station in FM station list)]     (6)

In one specific embodiment, if the averaged FM modulation difference is less than or equal to 10% (which may be calibratable), then the potential new entrant station is deemed to have the same audio content as the existing station in the FM station list. If, on the other hand, the FM modulation difference is more than 10%, then the target FM station may be inserted into the FM station list.

If the modulation is less than 10% but the signal quality of the target station is better than the signal quality of the existing station in the FM station list, then the existing station is replaced by the target station in the FM station list. Thus, the best alternate frequency is placed into the FM station list for the particular station in the FM band.

The above premise can be used in pause detect based modulation checks or during perceptual based checks. As mentioned hereinabove, in scenarios of simulcast audio, a pause in one station may result in a pause in the sampled station if the two stations are producing the same audio content. In cases where modulation checks are triggered not on pause but on perceptual based checks, as long as the source and target station frequency are sampled in intervals of 67 microseconds (Nyquist rate for 15 kHz), the modulation is within a bounded area. Gathering statistical data through this method for the latter case results in a confidence level building that is used to decide whether the source and target stations have the same audio content.

This scheme is repeated each time a new entry is to be entered into the FM station list to ensure that all entries are unique in nature. Thus, when a neighboring station of acceptable quality is found, it is compared against all existing entries in the FM station list through sampled four modulation averaged checks spaced out in time. Each check may require a back to back I2C write and read access. Average checks may be spaced out as mentioned hereinabove.

To ensure neighbor frequency check efficiency, each time a station is not inserted into the FM station as an individual entry (meaning its modulation average is under 10%), then, inside the station list memory, a byte field (link) which links the new station to the existing entry is updated to ensure further neighbor channel checks skip this station to achieve check efficiency. This may be called for because there are many frequency checks to handle with regard to the different permutations needed across frequencies. This also helps in reducing the 7 milliseconds checks up to the time interval of the trust timer.

As an example, assume a station frequency 87.5 MHz, which exists in the station list, is sampled, and the next frequency 87.6 MHz is sampled. If it is found that the modulation of the next frequency is within 10% (which is calibratable) after the four sample average, then the link may be set as 0 (index of 87.5 MHz) and an associated trust timer may be set for about fifteen minutes (which is calibratable). Subsequent checks may ignore checking 87.6 MHz until its trust timer expires.

A table depicting one embodiment of a station list learn memory for the European market is shown in FIG. 3. The station list memory is the repository from which the FM station list may be derived. The station list memory may include 205 entries for the largest FM range (e.g., 87.5 MHz to 108 MHz with 100 kHz steps). Whenever the tuner samples a station and acquires a PI code or finds that a frequency shares the same modulation levels of another frequency then the Link field may be updated to the parent frequency. The parent-child relationship entails that the content of the two frequencies be the same, and thus the FM station list should choose the better quality frequency among the parent-child to populate into the FM station list. With regard to AF switching methodology, the FM modulation checks can be used to provide a confidence level of an unmuted AF switch.

The invention may be applied to perceptually weighted checks. To complement the pause detect logic check, the invention provides a methodology which triggers a neighborhood frequency check when the currently listened-to station has poor reception quality. More particularly, when the currently listened-to station has poor reception quality, the present invention may "sneak in" a check performance that is not easily perceived by the user. In order to enable such checks, a perceptual weighting filter based on the quality parameter is utilized. The perceptually weighted checks take advantage of the poor signal reception of the presently listened-to station to perform checks.

In order to support the checks, a one shot timer having a duration of 500 ms is used to continuously check on the current quality state of the currently tuned-to station in FM mode. If the quality state indicates noise AND a previous quality check was not performed within the one second time frame, then a quality check is initiated. This one second check guard may ensure that back to back quality checks are not performed, because such back to back checks could be perceived by the user.

The perceptual filter that may be utilized includes a three-dimensional function which inputs field strength, multipath and ultrasonic noise into a quality factor. The three parameters may be received from the DSP through autoincrement registers.

The quality information gathered may be updated into what may be termed a "station list learn memory," which is mapped onto on-chip RAM. One embodiment of a station list learn memory for the North American market is shown in FIG. 4.

To optimize on RAM, instead of storing frequency, each frequency may be presented as an index that is mapped over the range. For example, in a frequency range spanning from 87.7 MHz to 107.9 MHz, index 0 represents frequency 87.7 MHz, and index 102 represents 107.9 MHz. To otherwise store the frequency uncoded in BCD format, for example, would consume two bytes, which is not an efficient use of memory.

Quality may be derived from the three-dimensional table taking into consideration fieldstrength, multipath and ultrasonic noise. The trust timer may be a timer value that gets set once a quality check has been performed on a station.

The station list-learn memory may serve as a common database from which the station list is derived. Stations may be added or removed from the FM station list according to whether they do or do not meet the quality criteria for inclusion in the FM station list.

The station list may be updated in a periodic manner from information gathered in the station list learn memory. The station list may be updated through one of the following four methods. First, when a user is tuned to an FM station and the volume knob is set to a perceivable volume level, then automatic quality checks of neighboring frequencies may be triggered whenever there is a pause in the currently tuned-to station's audio. The novelty of this idea is extended in the second through fourth options described below.

A second option for the automatic update of the FM station list is that when a user is tuned to an FM station and the volume knob is set to a perceivable volume level, then automatic quality checks of neighboring frequencies may be triggered whenever the currently tuned-to audio signal quality is poor. In one embodiment, the present invention provides a novel perceptual based table which characterizes the signal quality level. The characterization of the signal quality level may be used to trigger a 7 milliseconds long, unperceivable quality check of a neighboring frequency.

A third option for the automatic update of the FM station list is that when a user is tuned to an FM station and the volume knob is set to total mute (or if a mute pushbutton is activated), then the neighboring frequencies are checked and updated onto the FM station list. Additionally in this case, since the audio itself if totally muted, longer delve time on a station can be supported (e.g., 500 ms) to be able to acquire PI code, which in turn can be converted into FCC call letters based on the translation table in the RBDS standard. This gives the user more content information of the station other than frequency. If a user were to increase the volume knob to a perceived level (or de-activate the mute pushbutton), then these checks are stopped and an update of the FM station list is performed through pause-based updates as described in association with the first option above.

A fourth option for the automatic update of the FM station list is that when a user is sourced to a non-tuner source (e.g., CD mode, auxiliary mode), then the update of the FM station list can freely be performed without the concern that the update will be perceived by the user. The phrase "update of the FM station list" or similar as used herein may represent both the addition of strong stations and/or the deletion of weak stations in the FM station list during the user operation of the radio head unit.

The invention may be applied to AF switching methodology in a single tuner radio. As described above, the modulation based checks may complement the methodology for Single Tuner AF switching by determining a confidence level based check in cases where an unmuted AF switch is warranted. In the worst case, this prevents switching to a frequency that is not truly an alternate frequency but rather has audio modulation content that is wrong (i.e., that is different from that of the original frequency).

Figure 5:
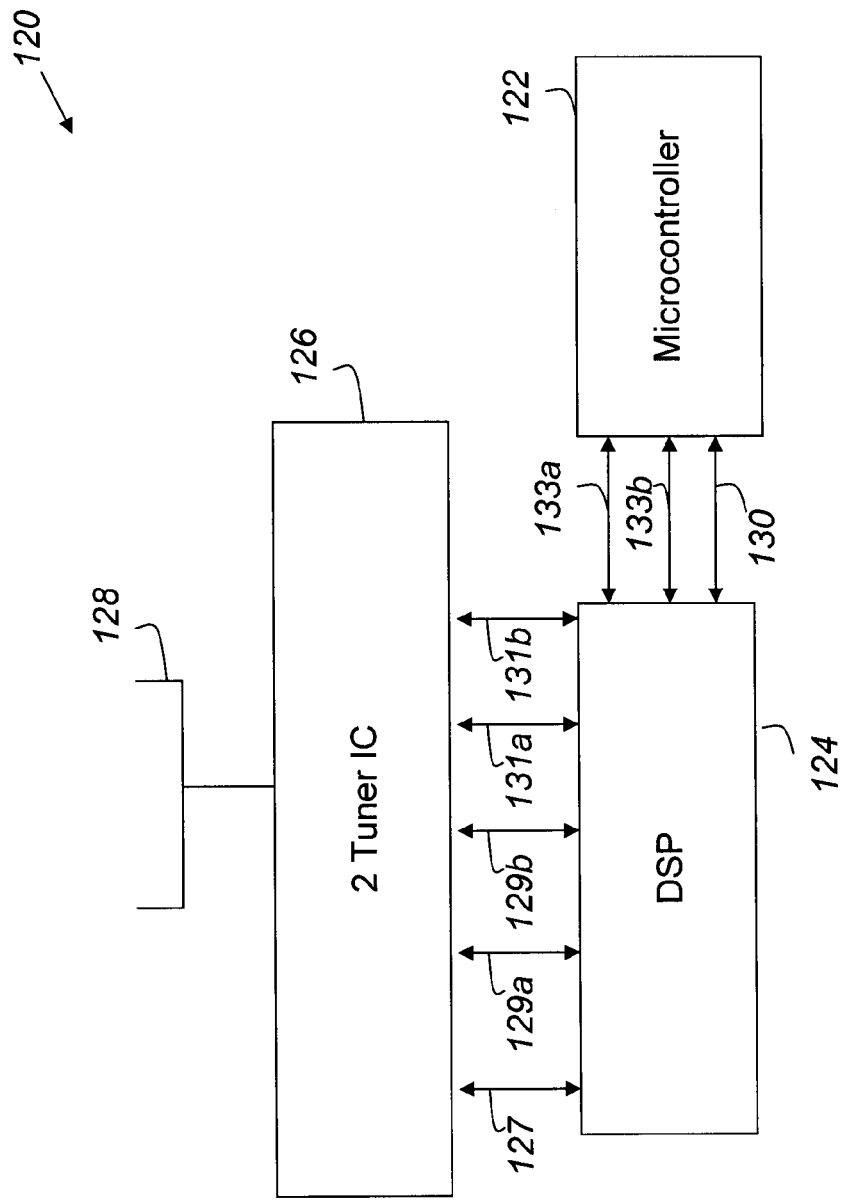
FIG. 5 is a block diagram of one embodiment of a dual tuner radio system of the present invention.

The invention may be applied to AF switching methodology in a dual tuner radio. A dual tuner radio system 120 of the present invention is illustrated in FIG. 5. Dual tuner radio system 120 may include a microcontroller 122 which may be used to process user input. A digital signal processor (DSP) 124 may be used to provide audio demodulation of the airborne Intermediate Frequency (IF) input signal. DSP 124 may also be used to provide quality information parameters to the main microcontroller 122 via a serial communication protocol such as I2C. The quality information parameters may include multipath, adjacent channel noise, FM frequency offset, FM modulation and field strength. The I2C channel may be a dedicated channel so that delays due to shared resource contentions are prevented. DSP 124 may rely on a Two-tuner IC 126 to perform the front end RF demodulation and the gain control. Two-tuner IC 126 may also output the IF to DSP 124 where the IF may be demodulated and processed. Two-tuner IC 126 may further provide a gain to the IF signal of up to 6 dBuV prior to forwarding the signal to DSP 124. Communication between Two-tuner IC 126 and DSP 124, as indicated at 127, may be via a serial communication protocol such as I2C, which may operate at 400 kbps.

An antenna system 128 may be communicatively coupled to Two-Tuner IC 126. Antenna system 128 may be in the form of a passive mast, or an active mast of phase diversity, for example.

AF sample lines 129*a-b* and AF hold lines 131*a-b* provide an interface between DSP 124 and Two-Tuner IC 126 to coordinate a quick mute as described hereinbelow. In contrast to the single tuner embodiment of FIG. 1, this dual tuner embodiment of FIG. 5 includes a separate AF Sample, AF Hold and Pause sensor for the second tuner path. Pause interrupt lines 133*a-b* between DSP 124 and microcontroller 122 may be used to inform microcontroller 122 whenever a pause occurs either on the primary or secondary tuner paths.

DSP 124 may provide signal quality parameterization of demodulated tuner audio and may make it available to microcontroller 122 via a serial communication bus 130. In one embodiment, serial communication bus 130 is in the form of a 400 kbps high speed I2C.

Figure 6:
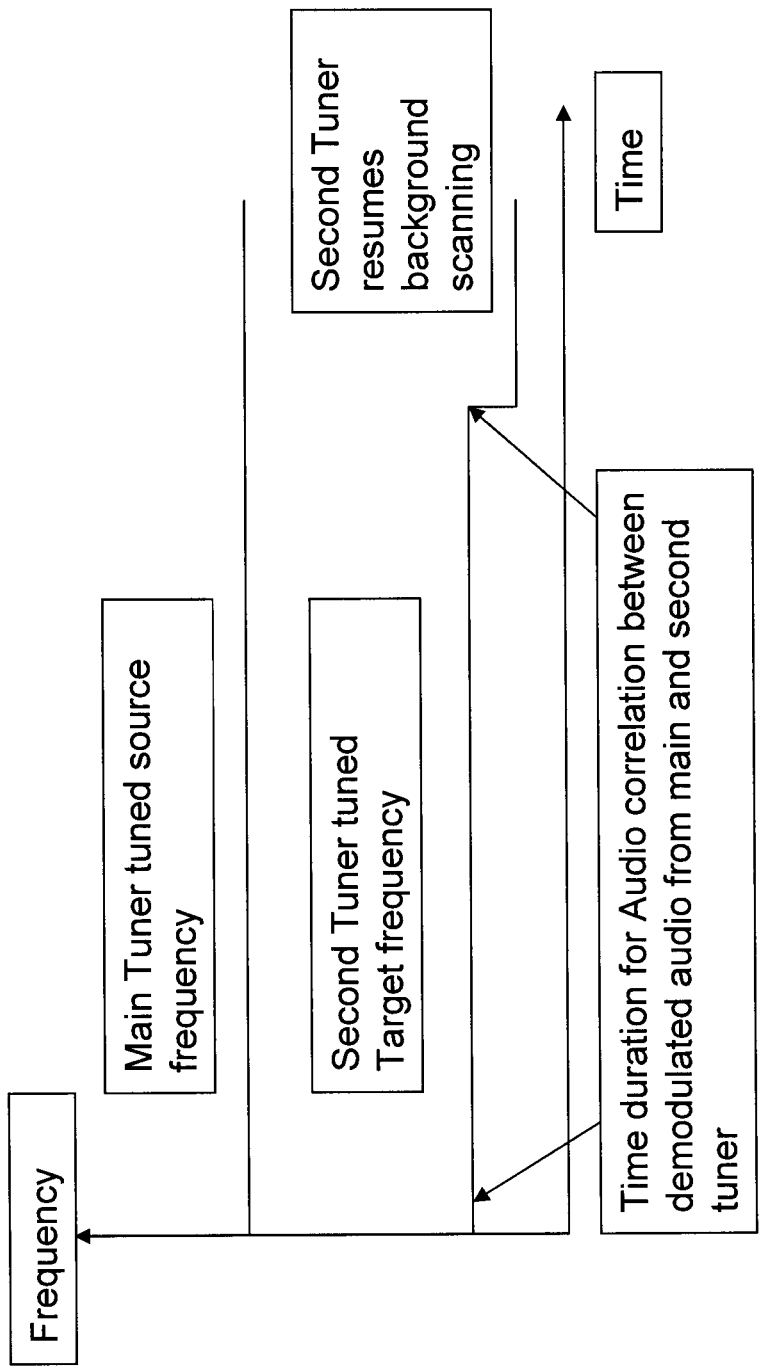
FIG. 6 is a frequency versus time plot for prior art audio correlation methodology using a royalty-based audio correlation algorithm.

For dual tuner variants, the currently known methodology is illustrated in FIG. 6. The second tuner may be used to conduct the PI check in an unperceived manner since the user is listening to the main tuner for the audio source. When the second tuner is not able to acquire the PI code, current DSP methods employ autocorrelation whereby the second tuner tunes to the target station and performs an autocorrelation-like function. The autocorrelation-like function may be computed using demodulated audio on both the main station tuned by the main tuner (source) and the target station.

There are a couple of problems with the above known approach. First, algorithms carry royalty costs for the end suppliers supplying to OEM customers. Second, causing the second tuner to dedicate itself on the tuned station for up to a few seconds in order to compare audio content may result in background scanning having to be stopped for that duration. This can include missing a traffic announcement, for example, via the second tuner from non-tuned traffic program stations that may not be tuned on the main tuner.

Figure 7:
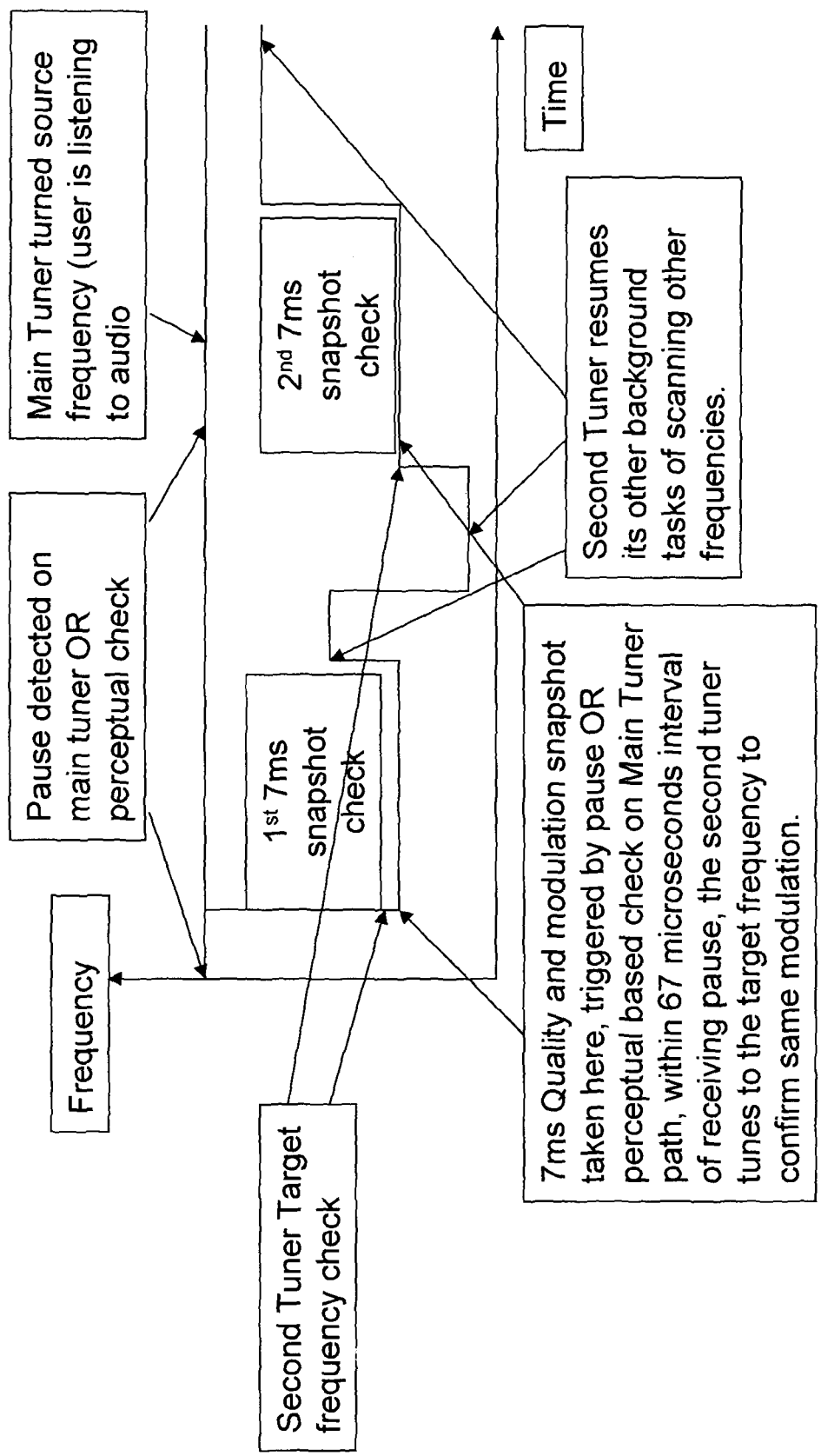
FIG. 7 is a frequency versus time plot for one embodiment of a method of the present invention for operating a radio within a vehicle.

Illustrated in FIG. 7 is a method of the invention in which the second tuner tunes to the target station. Because the main tuner is tuned to the source station, it is easy via software to query for the station's quality metrics at any time. When a pause interrupt or perceptual based check occurs on the main tuner path, the second tuner may be forced to jump to the target frequency (e.g., an Alternate Frequency where PI is not available) within 67 microseconds and acquire a snapshot quality check within a 7 millisecond interval. After this check, the second tuner can continue with its other background scanning tasks of scanning other frequencies.

In the embodiment described above, the checks are not done by tuning the second tuner to the main tuned frequency and to the target frequency. Rather, the second tuner is used to tune to only the target frequency. Thus, VCO coupling, which can cause distortion, may be avoided. For radios with phase diversity, tuning both the main and second tuner is possible since the two tuners are operated in different injection modes. For example, the main tuner may be in low injection mode while the second tuner may be in high injection mode. However, in one embodiment that can be employed for both radios employing phase diversity and radios employing external diversity, the second tuner may be used for only target station checks while the main tuner is sourced to the source station (i.e., the currently listened-to station).

Figure 8:
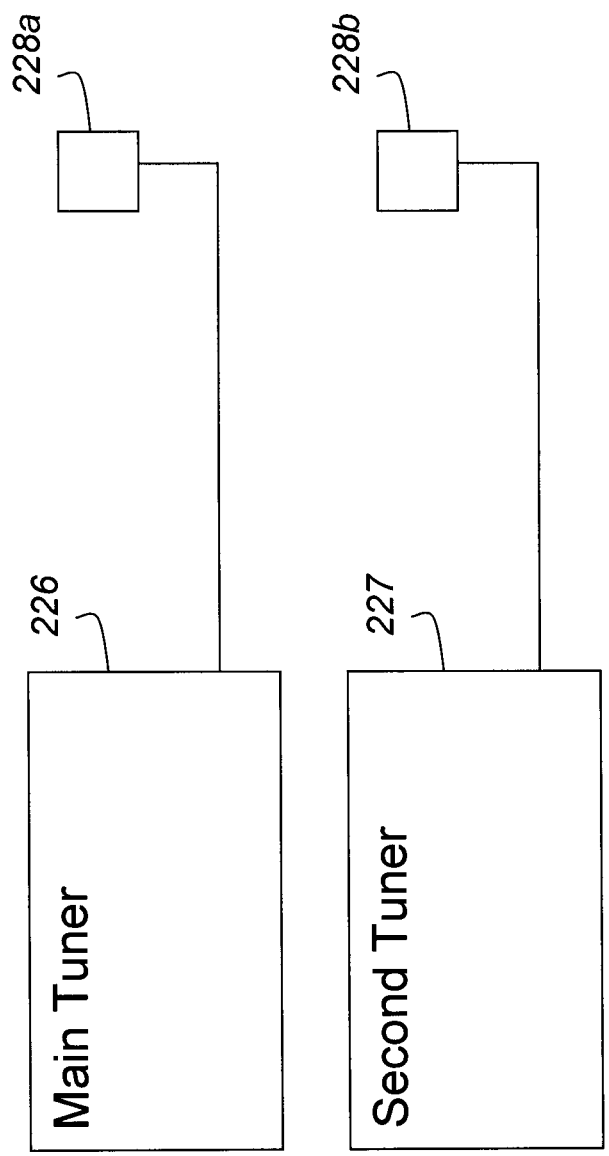
FIG. 8 is a block diagram of one embodiment of a dual tuner phase diversity system of the present invention.

Dual tuner radio variants can be of either the phase diversity type or the external switching diversity type. On dual tuner variants with phase diversity (FIG. 8), a main tuner 226 is connected to an antenna 228a, and a second tuner 227 is connected to an antenna 228b. While main tuner 226 produces an audio signal, second tuner 227 can scan the FM spectrum in the background until the main tuned-to station experiences severe multipath. In response to the severe multipath, the background scanning may be ceased and second tuner 227 may tune to the same station that main tuner 226 is tuned to. Thus, the audio quality may be enhanced by using algorithms known as Constant Modulus Algorithm (CMA) that make use of the phase differences between the main tuner demodulated audio and the second tuner demodulated audio.

For dual tuner variants with phase diversity, whenever the phase diversity is functionally enabled, the dual tuner in part operates mostly as a single tuner radio. The methods of the present invention may be applied to dual tuner variants with phase diversity whereby modulation checks of target AF stations can be performed prior to an AF switch by disabling phase diversity for the duration of the modulation checks triggered by pause, or in cases where audio quality is very poor even with application of phase diversity. The audio quality may be ascertained through quality checks of the currently tuned-to station.

Figure 9:
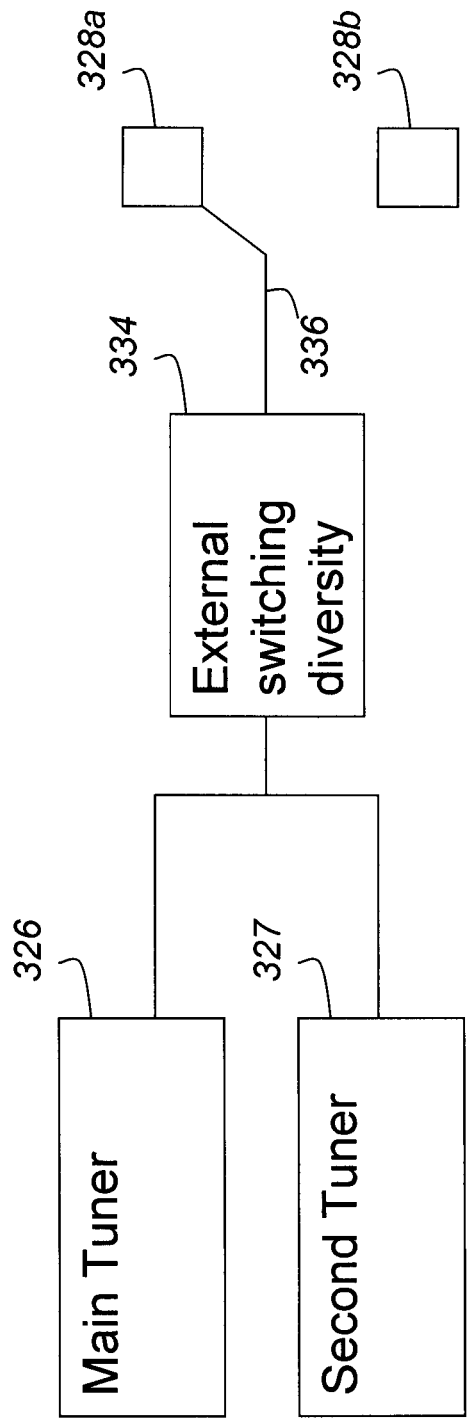
FIG. 9 is a block diagram of a dual tuner external switched diversity system of the present invention.

On dual tuner variants with external switching diversity (FIG. 9), a main tuner 326 and a second tuner 327 are associated with antennas 328a-b. While main tuner 326 produces an audio signal, second tuner 327 is constantly engaged in background scanning. The diversity in tuner variants with external switching diversity is a front end switching circuitry box 334 which chooses the better antenna signal quality. For example, as shown in FIG. 9, box 334 determines that antenna 328a is the stronger antenna, and thus chooses antenna 328a, as indicated at 336.

For dual tuner variants with external switching diversity, since the radio "sees" only one physical antenna, there is no phase diversity and phase diversity does not come into play. Thus, the second tuner can perform audio correlation methods in cases where the PI code is not receivable to hasten the AF switch.

In cases where audio correlation is warranted though, the current industry practice is for the second tuner to tune to the target frequency while the main tuner is tuned to the source station. Then the demodulated audio data is compared between the main tuner and the second tuner. Audio correlation metrics are computed for a specified duration of time, usually on the order of seconds before making a decision. This may require the payment of royalties for using the algorithm on the DSP to the DSP vendor. The present invention avoids the need for such royalty payments.

The present invention enables automated maintenance of an FM station list which preserves the integrity of the information presented while allowing for easy navigation and station browsing. In application to AF switching methodology, the invention complements existing single tuner RDS methods and provides a method of performing audio correlation using the second tuner for dual tuner variants.

In order to prevent wrong audio modulation to be heard during AF switch, the prior art employs dual tuner radio variants. In cases where prior to an AF switch, the PI code is not received, dual tuner radios employ what is termed as an audio correlation algorithm. The algorithm may be implemented by tuning the main tuner and second tuner to the source and target frequency, gathering the audio data, and employing auto-correlation methods to define their correlation. This may take between two and five seconds worth of audio sampling. The audio correlation algorithm requires royalty payments for dual tuner variants.

The present invention may be applied to both automated FM station list maintenance and AF switching in single and dual tuners. The invention advantageously adds elegance to the human machine interface in that the invention does away with having to support the manual station list update option to continuously update the FM station list.

The invention also advantageously maintains integrity of the FM station list by automatically updating the list. The FM station list does not become stale as long as the user is in FM source or non-tuner source. If a single tuner radio is in AM band, then the tuner cannot do background checks easily. Weak stations are removed in time, while strong stations and "new" entrants can be added without user intervention. The invention may further advantageously be applied in a low cost single tuner environment instead of having to have a second tuner to constantly scan the background frequencies in order to achieve similar results.

The invention may be applied to both consumer applications and automotive applications which utilize only a single FM tuner. The range of products that the invention may be applied to includes cell phones, radio head units, USB with FM receivers and other devices that support a display that can display an FM station list.

The human machine interface display of the FM stations for the North American market may be scalable in order to account for the varying display sizes. For example, a possible human interface display is shown below:

| Frequency | Call Letters |
|---|---|
| 90.1 MHz | WABE |
| 90.3 MHz | |
| 90.5 MHz | |

The FM stations can be ordered either in ascending frequency order or ascending or descending quality value.

With regard to application of the invention to AF switching, the invention provides a novel means to perform audio correlation in single tuner variants. FM audio is broadcast at a maximum of 15 kHz. Thus, the modulation checks may be performed at periodic intervals of 67 microseconds (1/15,000 second) intervals to avoid aliasing and satisfy the Nyquist sampling criterion, and hence gather an audio correlation data snapshot. In cases where pause durations are limited due to the audio content listened to, the radio can perform limited quick modulation and quality checks of 7 milliseconds duration and period of 67 microsecond intervals. The modulation and quality checks may be spaced out to gather modulation data using a perceptual filter. The modulation data gathered builds up a confidence level metric which can be used to hasten the AF switch in cases when it is warranted provided the confidence level built up exceeds a specified threshold.

If two frequencies have the same audio content, a pause in the currently tuned-to station may mean a pause also exists in the target alternate frequency if the alternate frequency has simulcast audio. Thus, the two frequencies' modulation levels may have strong correlation if the audio is simulcast in both stations with no delay as is the case with RDS stations. Herein modulation checks performed may enhance what is termed as audio correlation level to build up. When an AF switch is warranted due to signal fade on the currently tuned-to station and the target AF station has good quality, an AF switch can be attempted without invoking the costly PI check. Pauses of substantial duration can occur in both music and speech broadcasts on a radio station.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method of maintaining an FM radio station list, comprising the steps of:
    including a primary frequency in the FM radio station list;
    identifying a potential alternate frequency;
    performing an alternate frequency switch to the potential alternate frequency;
    performing a modulation based check including calculating an FM modulation difference associated with the primary frequency and the alternate frequency;
    determining whether the content of the potential alternate frequency is the same as content on the primary frequency, the determining being dependent upon the modulation based check; and
    replacing the primary frequency in the FM radio station list with the potential alternate frequency only if it is determined in the determining step that the content of the potential alternate frequency is the same as content on the primary frequency.

2. The method of claim 1 comprising the further step of comparing a signal quality metric of the alternate frequency to a signal quality metric of the primary frequency, the primary frequency in the FM radio station list being replaced with the alternate frequency only if it is determined that the signal quality metric of the alternate frequency is better than the signal quality metric of the primary frequency.

3. The method of claim 2 wherein the signal quality metric is dependent upon at least one of field strength, multipath, adjacent channel energy, frequency offset and FM modulation.

4. The method of claim 2 wherein the modulation based check is performed only if the signal quality metric of the alternate frequency exceeds a threshold level.

5. The method of claim 1 wherein the alternate frequency switch to the potential alternate frequency and the modulation based check on the alternate frequency are performed during a pause in a currently tuned-to frequency.

6. The method of claim 1 wherein if a signal quality of a currently tuned-to frequency is above a threshold level, then the alternate frequency switch to the potential alternate frequency and the modulation based check on the alternate frequency are performed during random periods of time.

7. The method of claim 1 comprising the further step of calculating a level of confidence that the potential alternate frequency is an actual alternate frequency for the primary frequency, the calculating being dependent upon the determining step, the replacing step being performed only if the level of confidence exceeds a threshold level.

8. A method of maintaining an FM radio station list, comprising the steps of:
    including a primary frequency in the FM radio station list;
    identifying a potential alternate frequency;
    performing an alternate frequency switch to the potential alternate frequency;
    performing a modulation based check including calculating an FM modulation difference by:
        taking a plurality of first samples of a modulation of the primary frequency;
        taking a plurality of second samples of a modulation of the alternate frequency;
        calculating a first average modulation difference of the first samples;
        calculating a second average modulation difference of the second samples;
        subtracting the second average modulation difference from the first average modulation difference to produce a subtraction quantity; and
        dividing the subtraction quantity by the first average modulation difference;
    determining that the content of the potential alternate frequency is the same as content on the primary frequency only if it is ascertained that the FM modulation difference is less than a threshold level; and
    replacing the primary frequency in the FM radio station list with the potential alternate frequency only if it is determined in the determining step that the content of the potential alternate frequency is the same as content on the primary frequency.

9. The method of claim 8 comprising the further step of comparing a signal quality metric of the alternate frequency to a signal quality metric of the primary frequency, the primary frequency in the FM radio station list being replaced with the alternate frequency only if it is determined that the signal quality metric of the alternate frequency is better than the signal quality metric of the primary frequency.

10. The method of claim 9 wherein the modulation based check is performed only if the signal quality metric of the alternate frequency exceeds a threshold level.

11. The method of claim 8 wherein the alternate frequency switch to the potential alternate frequency and the modulation based check on the alternate frequency are performed during a pause in a currently tuned-to frequency.

12. The method of claim 8 wherein if a signal quality of a currently tuned-to frequency is above a threshold level, then the alternate frequency switch to the potential alternate frequency and the modulation based check on the alternate frequency are performed during random periods of time.

13. The method of claim 8 comprising the further step of calculating a level of confidence that the potential alternate frequency is an actual alternate frequency for the primary frequency, the calculating being dependent upon the determining step, the replacing step being performed only if the level of confidence exceeds a threshold level.

\* \* \* \* \*